(12) United States Patent
Strachan et al.

(10) Patent No.: US 8,582,344 B2
(45) Date of Patent: Nov. 12, 2013

(54) MULTIPLEXER/DE-MULTIPLEXER MEMRISTIVE DEVICE

(75) Inventors: John Paul Strachan, Stanford, CA (US); Marco Fiorentino, Mountain View, CA (US); Wei Wu, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 302 days.

(21) Appl. No.: 13/120,903

(22) PCT Filed: Dec. 30, 2008

(86) PCT No.: PCT/US2008/088583
§ 371 (c)(1),
(2), (4) Date: Mar. 24, 2011

(87) PCT Pub. No.: WO2010/077245
PCT Pub. Date: Jul. 8, 2010

(65) Prior Publication Data
US 2011/0188294 A1 Aug. 4, 2011

(51) Int. Cl.
*G11C 11/34* (2006.01)

(52) U.S. Cl.
USPC .............................................. 365/148; 257/4

(58) Field of Classification Search
USPC .................. 365/148, 158, 100, 189.02; 257/4
See application file for complete search history.

(56) References Cited

U.S. PATENT DOCUMENTS

| | | | |
|---|---|---|---|
| 7,203,789 B2 | 4/2007 | Snider | |
| 2005/0250305 A1 | 11/2005 | Al-Rabadi | |
| 2006/0244047 A1* | 11/2006 | Gopalakrishnan et al. | ... 257/316 |
| 2006/0244058 A1 | 11/2006 | Wickramasinghe | |
| 2008/0001172 A1 | 1/2008 | Karg | |
| 2008/0068065 A1 | 3/2008 | Wickramasinghe | |
| 2008/0079029 A1 | 4/2008 | Williams | |
| 2008/0090337 A1 | 4/2008 | Williams | |
| 2008/0251840 A1 | 10/2008 | Wickramasinghe | |

OTHER PUBLICATIONS

International Search Report and Written Opinion, Jul. 24, 2009, PCT Application No. PCT/US2008/088583.
Sakamoto, Toshitsugu et al.; "Three Terminal Solid-Electrolyte Nanometer Switch"; Electron Devices Meeting, 2005. IEDM Technical Digest. IEEE International; Dec. 2005; 475-478; IEEE; USA.
Sakamoto, Toshitsugu et al.; "Nanobridge Technology for Reconfigurable LSI"; NEC Technical Journal; 2007; 72-75; vol. 2; No. 1.

* cited by examiner

*Primary Examiner* — Douglas King

(57) ABSTRACT

A multiplexing/de-multiplexing memristive device includes a memristive matrix containing mobile dopants; and programming electrodes which apply programming electrical field such that the mobile dopants selectively form a conductive band which connects a first signal electrode to one of a plurality of second electrodes. A method for operating a multiplexing/de-multiplexing memristive device includes applying a programming electrical field to achieve a first dopant configuration in a memristive matrix, the first dopant configuration connecting a base electrode to a input/output electrode; conducting an electrical current from between the base electrode and the input/output electrode; and applying a second programming electrical field to achieve a second dopant configuration, the second dopant configuration connecting the base electrode to a second input/output electrode; and conducting an electrical current from the base electrode to the second input/output electrode.

20 Claims, 8 Drawing Sheets

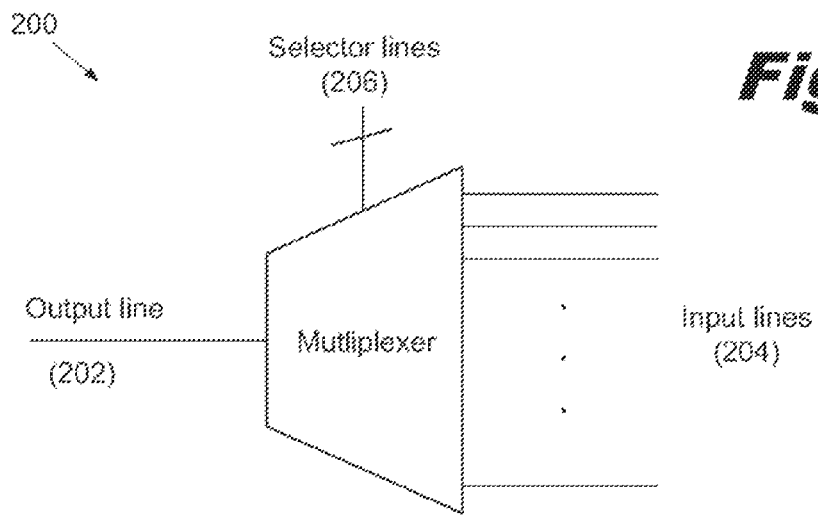
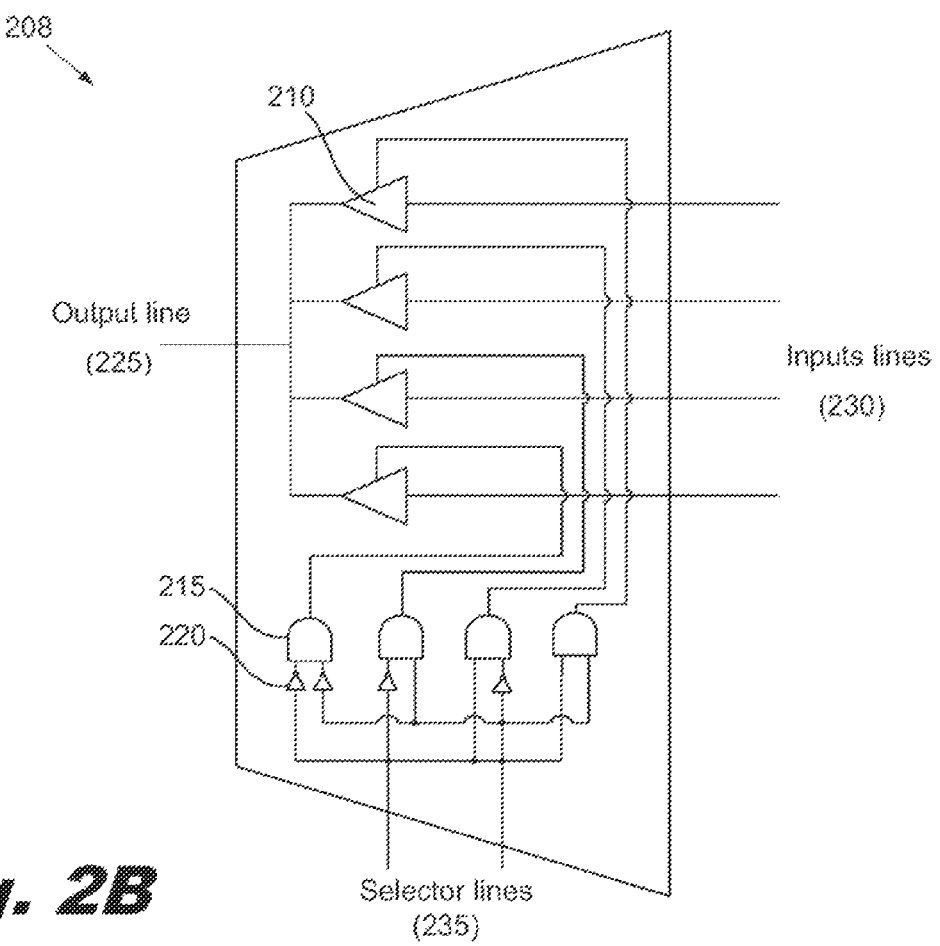

MULTIPLEXER/DE-MULTIPLEXER MEMRISTIVE DEVICE

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable doped matrix. After removal of the electrical field, the location and characteristics of the dopants remain stable until the application of another programming electrical field. This phenomenon is most strongly evident in nanometer scale devices and allows the device to "remember" past electrical conditions.

There is a long felt but unfulfilled need for electrical components which retain a memory of past conditions. For example, these electrical components could be self-configured to select a given output, multiplex or de-multiplex a data stream, store data, calibrate circuits, or provide fuzzy logic/neural learning capabilities.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 2A and 2B are an illustrative multiplexer diagram and a circuit schematic for a multiplexer, respectively, according to one embodiment of principles described herein.

Throughout the drawings, identical reference numbers designate similar, but not necessarily identical, elements.

DETAILED DESCRIPTION

Figure 1A:
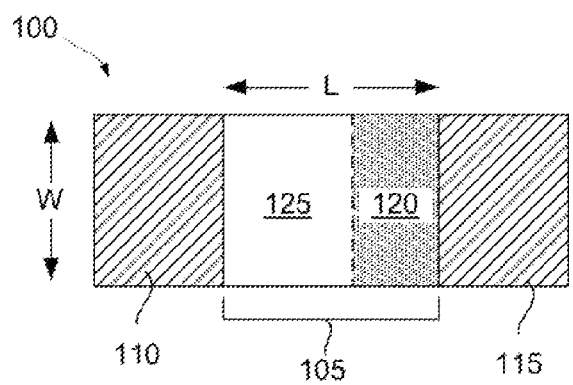
FIGS. 1A-1D are illustrative diagrams which show the fundamental operating principles of a memristive device, according to one embodiment of principles described herein.

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field.

Throughout the specification and appended claims the term "memristor" or "memristive" is used to describe a matrix/dopant combination which exhibits dopant motion in the presence of a programming electrical field and long-term dopant stability within the matrix when the programming field is removed. This memristive effect is most strongly evident in nanometer scale devices and allows the device to "remember" past electrical conditions.

There is a long felt but unfulfilled need for memristive circuit components which retain a memory of past conditions. For example, these memristive circuit components could be used to store data, calibrate circuits, or provide self-programming, fuzzy logic, or neural learning capabilities. One application where memristive circuit components could be used is in a solid state memory device. The memristive circuit components could provide the solid state memory device with high storage density, no power requirement for long term data retention, and fast access times. Other examples may include: self-configuring switching devices, self-programming circuit elements, memory devices capable of multi-state storage; solid state elements which can be used to tune circuits, analog neuronal computing devices which share fundamental functionalities with the human brain; and electronic devices for applying fuzzy logic processes.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much voltage was previously applied and for how long. The motion of these dopants alters the electrical resistance of the memristor. The dopants remain in this displaced state over long periods of time, thereby retaining a memory of the past electrical fields applied to the device. The resistance characteristics of the memristor are stable until another electrical field is applied to the memristor which has sufficient intensity or duration to induce dopant motion.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A shows an illustrative two-terminal memristive switch (100). According to one embodiment, the two-terminal memristive switch (100) is comprised of a first electrode (110) and second electrode (115) which are in electrical and physical contact with the memristive matrix (105). Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons through the switch. The basic mode of operation is to apply an electrical field (the drift field, which may exceed some threshold for enabling the motion of the ions in the primary material) across the switch which is large enough to cause an ionic species to be transported within the memristive matrix. The ionic species are specifically chosen from those that act as electrical dopants for the memristive matrix, and thereby change the electrical conductivity of the matrix from low conductivity (i.e. a not intentionally doped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature. This ensures that the switch is nonvolatile, that is, that it holds its state after the drift field has been removed.

Illustrative examples of suitable memristive combinations are given in Table 1, below. The table lists matrix materials, secondary material, and dopant species for each memristive combinations. The memristive matrix is typically a highly insulating stoichiometric compound. The memristive matrix is converted into the secondary material by the motion of the dopant into the intrinsic (not intentionally doped) regions of the matrix. Consequently, regions converted into secondary material contain a large number of dopants and are much more conductive than the intrinsic matrix.

TABLE 1

List of Examples of Compatible Primary and Secondary Materials and Dopant Species

| Matrix | Secondary Material | Dopant Species |
| --- | --- | --- |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN: S | Sulfide Ions |

Applying a high voltage across the electrodes (110, 115) causes both electron current to flow and dopant motion through the matrix material, whereas at a low voltage bias the dopant motion is negligible, which allows the characteristics of the memristor to remain unchanged.

These dopants may be impurity atoms such as hydrogen or some other cation species, such as alkali or transition metals, that act as electron donors for the matrix material. Additionally or alternatively, the dopants may be anion vacancies, which act as donors within the matrix. It is also possible to drive anionic species into the matrix material, which will become electron acceptors (or hole donors). The matrix material may be a thin film (generally less than 50 nm thick), and is in many cases nanocrystalline, nanoporous, or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid (e.g., the time required for a diffusive process varies as the square of the distance covered, so the time to diffuse one nanometer is one-millionth the time required to diffuse one micrometer). Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, only a voltage bias of 1 Volt will produce the required electrical field intensity.

There can be a variety of junctions within the memristive device where two dissimilar materials are joined to each other. For example, the memristive matrix can be contacted by electrodes which are made from metal or semiconductors. Additionally, within the matrix, regions with high concentrations of mobile dopants can contact regions which have been depleted of mobile dopants. In some cases, contact by dissimilar materials can deplete a doped material of free charge carriers, so in fact the doped material has a local net charge that depends on the identity of the dopants—positive in the case of donors and negative in the case of acceptors. These junctions electrically resemble Schottky barriers. The traditional description of a metal-semiconductor Schottky barrier is modified by the fact that the materials are structured at the nanometer scale, and so the structural and electrical properties are not averaged over the large distances over which theory of semiconductor-metal contacts have been developed.

Conduction of electrons through the matrix material is via quantum mechanical tunneling of the electrons. When a semiconducting matrix material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

As noted above, the matrix material has certain properties that enable memristive functions. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability, to avoid inadvertently turning the device from ON to OFF or vice versa via ionized species diffusion, rather than by intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). "Strongly ionic conductors" would have large ionized species mobilities and thus would not be stable against diffusion.

According to one embodiment, the memristive matrix (105) may be initially comprised of two separate materials or layers. A first insulating layer (125) has very few dopants and prevents electrical current from flowing between the two electrodes (110, 115). A second highly doped layer (120) is conductive and serves as a source of dopants which can be moved into the first insulating layer (125) to change the overall electrical conductivity of the memristive matrix (105). Consequently, in the configuration illustrated in FIG. 1A, the memristive switch (100) is open.

According to one illustrative embodiment, the first insulating layer (125) is comprised of intrinsic titanium dioxide ($TiO_2$). Intrinsic titanium dioxide ($TiO_2$) is an insulator, having a resistivity of approximately $10^{12}$ ohms per centimeter at 25° C. The second highly doped layer (120) is comprised of oxygen depleted titanium dioxide ($TiO_2$), where the subscript "x" indicates that the titanium dioxide has a small deficit of oxygen atoms in the crystal structure. These positively charged oxygen vacancies are the dopants in this embodiment. Even relatively low concentrations of oxygen vacancies (below 2%) result in a large increase of the electrical conductivity within the titanium dioxide. The oxygen vacancies act as electron donors, thus $TiO_{2-x}$ is an n-type semiconductor. Additionally, the oxygen vacancies move within the titanium dioxide under the influence of electrical fields. For example, electrical fields between 10,000 volts per centimeter and 100,000 volts per centimeter may be sufficient to physically relocate the oxygen vacancies.

The memristive matrix (105) has a length of "L" and a width of "W" as shown in FIG. 1A. For purposes of illustration only, assume that the length "L" is 10 nanometers and the width "W" is approximately 5 nanometers. Consequently, to apply an electrical field of 100,000 volts/centimeter across the memristive material (105), a voltage bias of 10 volts would be applied across 3C the electrodes (110, 115).

The dopants may originate from a variety of sources. The matrix material may be initially formed with a number of dopants distributed throughout the matrix. A programming electrical field can then be used to displace the dopant to form intrinsic regions and doped regions within the matrix. In other embodiments, the matrix material may be deposited in its intrinsic form. A sacrificial layer is then deposited onto the intrinsic material which provides the dopants by chemically reacting with the intrinsic matrix. For example, a layer of intrinsic titanium dioxide may be deposited, followed by a layer of aluminum. The elemental aluminum has a high affinity for oxygen molecules and will chemically combine with a number of oxygen molecules which were previously bound within the titanium dioxide matrix, thereby creating aluminum oxide. This creates oxygen vacancies within the titanium dioxide matrix. The oxygen vacancies then act as dopants within the titanium dioxide matrix. The aluminum/aluminum oxide layer can then be striped from the matrix. In other embodiments, the aluminum may remain within the memristive device or be used as an electrode.

In an alternative embodiment, the matrix may be made with an intrinsic layer and a separate doped layer. The application of a programming electrical field to the memristive device then allows the dopants to be distributed as desired throughout the matrix. Additionally or alternatively, a dopant source particles or layers may be included in the memristive device. The dopant source particles or layers may act as a source of dopants in a variety of ways. For example, the dopant source particles or layers may have the ability to generate large numbers of dopants under the influence of an external field of high enough strength. Typically, this electrical field is much higher than the programming electrical field. For example, a number of titanium particles or layers could be included within the intrinsic titanium dioxide matrix. These titanium particles would then react with a portion of the oxygen atoms contained within the intrinsic titanium dioxide matrix to produce oxygen vacancies.

Additionally, a passivation layer may be formed over a memristive device to prevent atmospheric oxygen or other contaminants from chemically altering the composition of the memristive device. For example, if a passivation layer is not present, an oxygen depleted titanium dioxide matrix may lose dopants over time as a result of atmospheric oxygen filling the oxygen vacancies.

The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
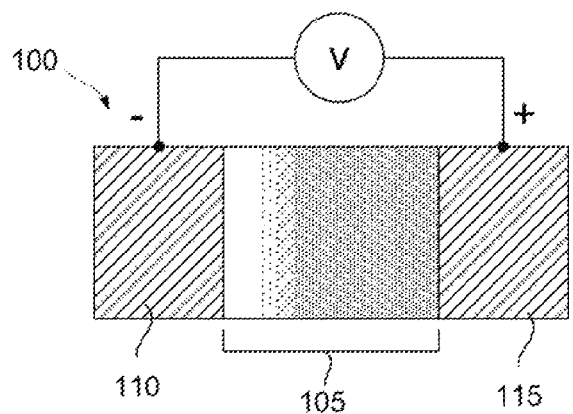

FIG. 1B illustrates the movement of the oxygen vacancies from the highly doped region (120, FIG. 1A) into the intrinsic region (125, FIG. 1A) as a result of an applied electrical field. The polarity and voltage difference which is applied across the memristive matrix (105) may vary according to a variety of factors including, but not limited to: material properties, geometry, dopant species, temperature, and other factors. Where titanium dioxide is used as the matrix, the oxygen vacancies have a positive charge, consequently a positive voltage is applied to the right electrode (115) to repulse the oxygen vacancies and drive them toward the left electrode (110). A negative voltage may also be applied to the left electrode (110) to further increase the electrical field and draw the positively charged vacancies toward the left electrode (110).

Figure 1C:
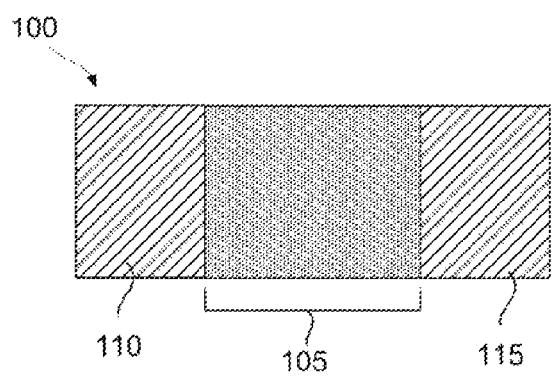

FIG. 1C illustrates the memristive switch in the fully "ON" position, with the dopants fully distributed throughout the memristive matrix (105). The left and right electrodes (110, 115) are electrically connected and can pass lower voltage electrical signals through the memristive matrix (105). As discussed above, the location and distribution of the dopants can remain stable over long periods of time or until another programming voltage is applied. In the fully "ON" state, the memristive matrix (105) is not a perfect conductor and still interposes an electrical resistance between the two electrodes (110, 115). This electrical resistance may be influenced by a variety of factors, including, but not limited to the geometry of the memristive matrix and the electrodes, the dopant concentration, the distribution of the dopants through out the memristive matrix, the species of dopant, the electrical characteristics of the matrix material, the temperature of the device, and other factors.

Figure 1D:
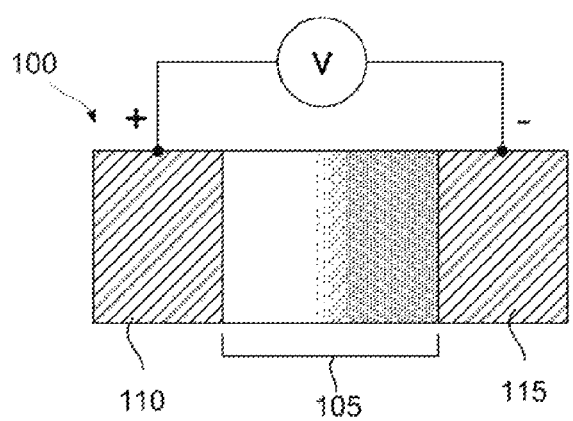

FIG. 1D illustrates the application of another programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and negative voltage is applied to the right electrode (115), thereby driving the dopants to toward the right electrode (115). This returns the left most portion of the memristive matrix (105) to its intrinsic and insulating state. The memristive switch (100) is then in a fully "OFF" configuration.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

In some circumstances, it can be desirable for the memristive matrix to retain some electrical resistance. For example, in the fully "ON" configuration illustrated in FIG. 10, if the resistance of the memristive matrix (105) is negligible, the two electrodes (110, 115) and the memristive matrix (105) can be thought of as a single electrical conductor. The application of a programming voltage across the two electrodes (110, 115) results in a large flow of current through the switch, but very low voltage difference between the two electrodes (110, 115). Consequently, the electrical gradient between the left and right electrodes (110, 115) is small, making it very difficult to move the dopants away from either electrode. This would result in the memristive switch (100) being permanently stuck in a fully "ON" or short circuited configuration.

To prevent the "short circuiting" scenario described above and to provide additional functionality to the switching device, a number of additional electrodes and memristive geometries could be used.

According to one illustrative embodiment, a memristive device can function as a multiplexer. FIG. 2 is a diagram that shows an illustrative multiplexer (200). In electronics, a multiplexer is a device which selects one out of many analog or digital input signals and outputs the selected signal on a single output line. An electronic multiplexer makes it possible for several signals to share one expensive device or other resource. For example, an analog-to-digital converter or communication line can be shared by multiple signal sources, rather than having one device per input signal. A de-multiplexer is a device which performs the inverse operation of a multiplexer. Specifically, a de-multiplexer is a device which takes a single input signal and selects one of many data-output lines. The input signal is routed to the selected output line.

A multiplexer can be considered a multiple input, single output switch and a de-multiplexer can be thought of as a single input, multiple output switch. FIG. 2A is a diagram of a conventional multiplexer (200). The multiplexer (200) has a single output line (202) opposite a plurality of input lines (204). The selector lines (206) are used to select which input line (204) is connected to the output line (202).

FIG. 2B is shows an illustrative circuit schematic for a digital 4:1 multiplexer (208). The multiplexer (208) has four input lines (230) and one output line (225). The selector lines (235) are used to select which of the four input lines is connected to the output line (225). The circuit is comprised of four inverters (220), four AND gates (215), and four 3-state buffers (210). The inverters (220) and AND gates (215) act as a digital decoder which converts the binary input of the selector lines (235) into control signals for the 3 state buffers (210). In a digital multiplexer or de-multiplexer, the number of selectors lines is related to the number of input lines (for a multiplexer) or output lines (for a de-multiplexer) by the relationship $s=\log 2(n)$, where s is the number of selector lines and n is the number of inputs or outputs. To create multiplexers which are configured for higher numbers of inputs, a number of smaller multiplexers can be interconnected. As can be seen from the circuit schematic, a conventional multiplexer or de-multiplexer can be a relatively complex and take a significant amount of real estate on an integrated circuit. Additionally, neither the multiplexer circuit nor the de-multiplexer circuit is capable of performing the inverse operation (i.e. a multiplexer can not perform a de-multiplexing operation and a de-multiplexer can not perform a multiplexing operation). Consequently, if both multiplexing and de-multiplexing functionalities are desired within an integrated circuit, both multiplexing circuit and de-multiplexing circuitry must be included in the integrated circuit.

Figure 3A:
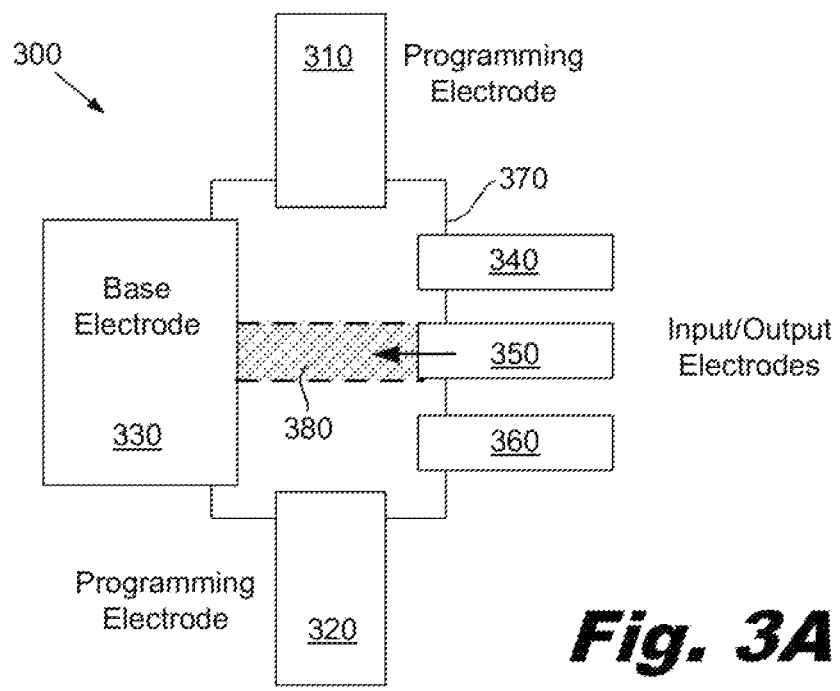
FIGS. 3A and 3B are diagrams of an illustrative memristive device which can be self-configured for multiplex/de-multiplex operations, according to one embodiment of principles described herein.
Figure 3B:
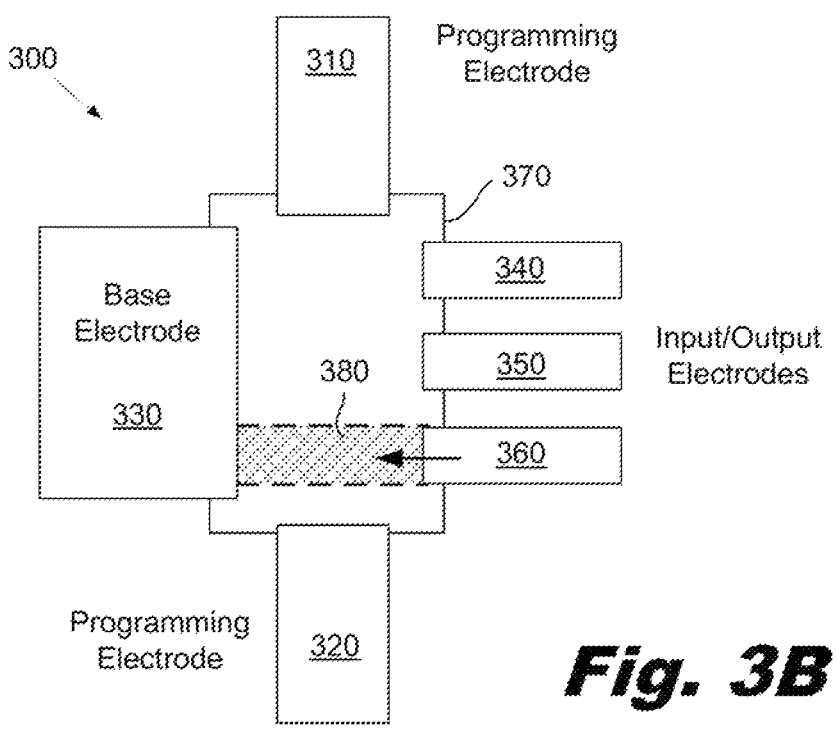

FIG. 3A shows an illustrative memristive multiplexer/de-multiplexer (300) which implements functionality of the digital multiplexer and a de-multiplexer into single nanoscale device. The memristive multiplexer/de-multiplexer (300) is equally capable of multiplexing operations and de-multiplexing operations. The memristive multiplexer/de-multiplexer (300) has no directional preference and can perform either task without internal reconfiguration. In contrast, a conventional de-multiplexer has distinct implementation differences from a multiplexer and requires a separate dedicated system of circuits.

According to one illustrative embodiment, the memristive multiplexer/de-multiplexer (300) includes a memristive matrix (370), two programming electrodes (310, 320), a plurality of input/output electrodes (340, 350, 360), and a base electrode (330). The memristive matrix (370) in its not intentionally doped state is an electrical insulator. As discussed above, when dopants are introduced into a portion of the memristive matrix (370), the electrical conductivity in that region dramatically increases. The programming electrodes (310, 320) are configured to generate an electrical field across the memristive matrix (370). This electrical field has sufficient intensity to move a dopant band (380) through the memristive matrix (370). The dopant band (380) is comprised of a relatively high concentration of dopants which create an area of higher electrical conductivity within the memristive matrix (370).

The dopant band (380) connects the base electrode (330) to one or more of the input/output electrodes (340, 350, 360) on the opposite side of the memristive matrix (370). The programming electrodes (310, 320) can be used to move the dopant band (380) from one input/output electrode (340, 350, 360) to another input/output electrode (340, 350, 360). According to one illustrative embodiment, the programming electrodes (310, 320) can also control the width of the dopant band (380). A wide dopant band could make connections between two or more of the input/output electrodes (340, 350, 360). In a multiplexer operation, this could allow for two signals to be combined and output through the base electrode (330). In a de-multiplex operation, a signal from the base electrode (330) could be replicated on two or more of the smaller input/output electrodes (340, 350, 360).

In addition to reducing the size and internal complexity of implementing multiplexers/de-multiplexer functionality, the memristive multiplexer/de-multiplexer (300) maintains its switching state when an electronic device is turned off or powered down. Consequently, the memristive multiplexer/de-multiplexer (300) remembers its switching state when power is returned, resulting in an "instant on" configuration. Even during operation, the multiplexer/de-multiplexer (300) does not require any power input to maintain a connection. Only during switching from one connection to another is power required by the programming electrode. In largely static situations, the use of a memristive multiplexer/de-multiplexer (300) and other memristive devices could lead to significant power savings.

As discussed above, after the dopants have been moved to a new location by a relatively high programming voltage, the dopants remain in place over long periods of time. Typically, the signal voltages passed between the base electrode (330) and the input/output electrodes (340, 350, 360) will not be sufficient to significantly influence the position of the conductive channels. For example, the programming voltages may be on the order of 10 volts, while the signal voltage may be on the order of 1 volt.

Memristive devices can be used in a variety of situations to tune various components in an integrated circuit or system. In one illustrative application, it may be desirable to change the operating characteristics of some circuits to match a particular signal input for making various measurements. For example, many transducers or measurement systems perform best when there is a "bridge circuit", in which the resistance of a variable resistor is tuned in order to balance a differential circuit to make a very precise measurement. One example is measuring a precise voltage difference for a thermocouple, but there are many other examples of bridge circuits used for measurements.

Additionally, it can be important for a number of cooperating circuits to have compatible characteristics. If the characteristics of various circuits are not compatible, the system performance could be compromised. In one embodiment, a memristive device can be used as a trimming resistor to adjust the impedance of a circuit. For example, the memristive device can be used to match the output impedance of a source circuit with the input impedance of a load circuit to maximize the power transfer and minimize reflections from the load. In other cases where signal transfer is important, impedance bridging techniques can be used to maximize the transfer of a voltage signal to the receiving device.

There is a certain amount of variability in all electronic circuits, which means that circuits that are fabricated will have slightly different operating parameters, in terms of their speed of operation and the delay time for signals to propagate through the circuit. In the past, this problem was handled by installing mechanically adjustable "trim pots" in circuit boards. An expert engineer was required to test and tune up a circuit in order to optimize its properties—this was done by examining the electronic signal at various test points on a circuit board using an oscilloscope, and then using a screw driver to adjust the trim pot to change the resistance of the variable resistor to bring the impedance of the circuit up to its optimal performance. This was required when first testing a circuit to ensure that it worked properly, and with time, various elements in a circuit could change, so an expert technician was required to retest and retune a circuit in the field. As circuits became more integrated, this requirement for tuning became less necessary because the reproducibility of integrated circuit components improved. Also, there is no place on an integrated circuit to place a trim pot, so for the most part, integrated circuits cannot be tuned. As feature sizes are getting smaller, the variability of component properties is necessarily increasing, just because a single atom determines the lower limit of the uncertainty in a feature size. Thus, future generations of circuits will need to have trim pots to be able to tune and optimize the circuits. In fact, as device variability gets larger, it will be likely that circuits will not work at all if they cannot be tuned. Consequently, it is becoming increasingly important to have flexible, reliable, and effective method of tuning modern electrical circuits.

Memristive devices could be used in combination with various feedback circuits to initially tune an integrated circuit and to continually optimize the performance of a circuit during operation. Thus, the performance of the circuit can be continually improved with such memristive devices and feedback elements. As certain components in the circuit failed, the circuit would use the memristive devices to reconfigure and re-optimize itself. Thus, such circuits should have the ability to degrade gracefully with age, rather than die a sudden death when a single component failed.

FIGS. 4A-4F show an illustrative memristive multiplexer/de-multiplexer (400) that is connected to a resistor network (440). According to one illustrative embodiment, the multiplexer and resistor network combination can be used to tune a circuit (430). The memristive multiplexer/de-multiplexer (400) is comprised of a memristive matrix (402), two programming electrodes (405, 420), a large electrode (410), and an array of input/output electrodes (435). As previously described, a memristive de-multiplexer and a memristive multiplexer may be structurally identical, with the only difference being the direction of the current flow. In the embodiment shown in FIGS. 4A-4F there is no directional current preference and the memristive multiplexer/de-multiplexer (400) would be equally effective functioning as either a multiplexer or de-multiplexer.

According to one illustrative embodiment, the resistor network is made up of a variety of resistors with different values. The values may be selected according to the given application. For example, a specific value may be selected to match a desired system state. In the example shown in FIGS. 4A-4F, the resistor network (440) is comprised of a direct connection (0 Ohms), a 1000 Ohm resistor (labeled "1 kΩ"), a 10,000 Ohm resistor (labeled "10 kΩ"), and a 100,000 Ohm resistor (labeled "100 kΩ"). The resistor network (440) is connected to a circuit (430). A measuring device (425) is interposed between the circuit (430) and the memristive device (400).

A dopant band (415) is located within the memristive matrix (402). As discussed above, the dopant band (415) makes an electrical connection between the large electrode (410) and one or more of the input/output electrodes (435). In the configuration shown in FIG. 4A, the dopant band forms a connection between the base electrode (410) and the input/output electrode connected to the 10 kΩ resistor.

Figure 4A:
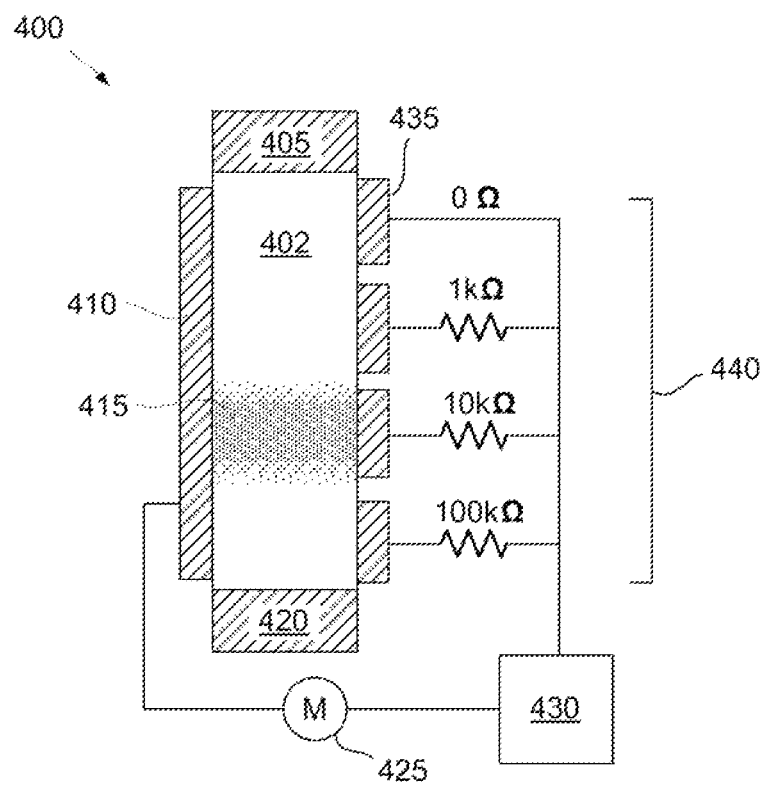
FIGS. 4A-4F are diagrams of an illustrative memristive device configured to select resistances from a resistor network, according to illustrative embodiment of principles described herein.
Figure 4B:
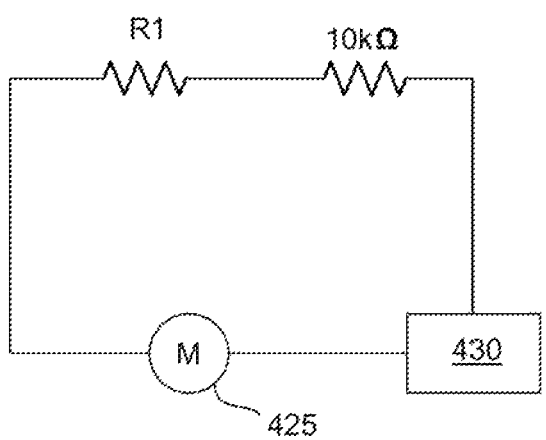

FIG. 4B shows an electrical schematic of the system illustrative in FIG. 4A. The resistance of the memristive device (400) and resistor network (440) is illustrated as a first resistor (R1) in series with the 10 kΩ resistor. The first resistor (R1) represents the combined resistance of the plate electrode, input output electrode, wiring, contact resistances at interfaces, and dopant band. According to one embodiment, the first resistor (R1) may be relatively low, on the order of 1 to 10 Ohms. Because the resistors are in series, the total resistance equals the sum of the electrical resistances of resistor R1 and the 10 kΩ resistor.

Unlike many conventional switching devices, memristive device is not necessarily an "all or nothing" device. The memristive device can vary the resistance of the conductive paths in an analog manner by increasing or decreasing the concentration of dopants in the conductor path. This change in resistance could provide a method of selectively attenuating a signal or tuning another characteristic within a system. The location of the dopant band could also be used to increase or decrease the resistance of the connection between a base electrode and the array of input/output electrodes. For example, the dopant band may be formed with dopant distribution that does not have sharp or distinct edges. This dopant distribution may have a significantly higher dopant concentration at the center of the band than at the edges of the band. This will produce a lower electrical resistance in the center of the band and higher resistances on the edges of the band. Consequently, when this type of dopant band is positioned with the center of the dopant band contacting an input/output electrode, a low resistance connection is made. When this dopant band is moved slightly away from the input/output electrode such that the electrode now contacts only one edge of the dopant band, a higher resistance connection is made.

Figure 4C:
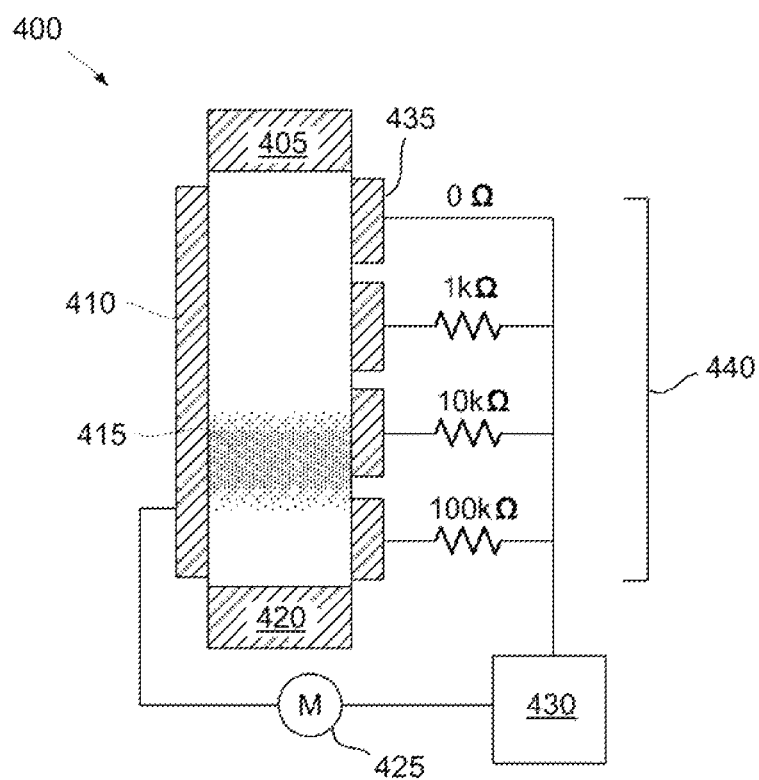

In FIG. 4C, the programming electrodes (405, 420) have been energized such that the dopant band (415) has been moved downward. The lower fringe of the dopant band (415) is now beginning to contact the input/output electrode which is connected to the 100 kΩ resistor. Consequently, current paths exist through both the 10 kΩ and the 100 kΩ resistors. However, because the current path to the 100 kΩ resistor must pass through the lower dopant concentrations at fringe of the dopant band (415), the dopant band (415) may contribute a significant amount of resistance to that current path.

Figure 4D:
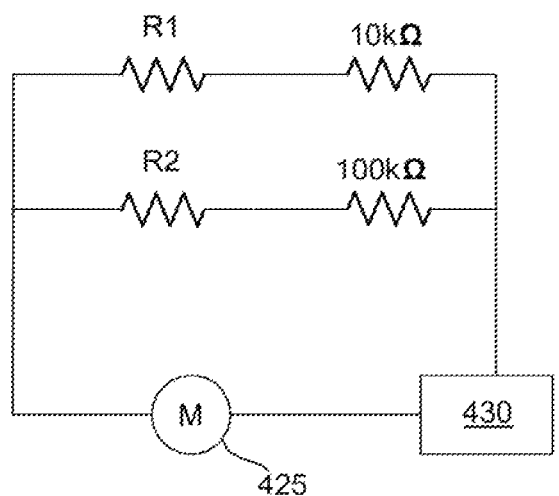

FIG. 4D shows an electrical schematic of the system illustrated in FIG. 4C. The resistance of the memristive device (400) and resistor network (440) is illustrated as a first resistor (R1) in series with the 10 k0 resistor and, in parallel, a second resistor (R2) in series with the 100 k0 resistor. As discussed is above, the first resistor (R1) represents the nominal resistance of the memristor device. The second resistor (R2) represents the resistance due to the lower dopant concentrations through the fringe of the dopant band and may be significantly higher than (R1).

The resistance of the memristive device (400) and the resistor network can be calculated using well known equations for series and parallel resistances. As discussed above, resistors in series are simply summed to find the total resistance. The equation for total resistance ($R_{total}$) is given below:

$$\frac{1}{R_{total}} = \frac{1}{(R_1 + 10,000)} + \frac{1}{(R_2 + 100,000)} \qquad \text{Eq. 1}$$

The total resistance, $R_{total}$, is less than (R1+10 kΩ) and will change as a function of both R1 and R2.

Figure 4E:
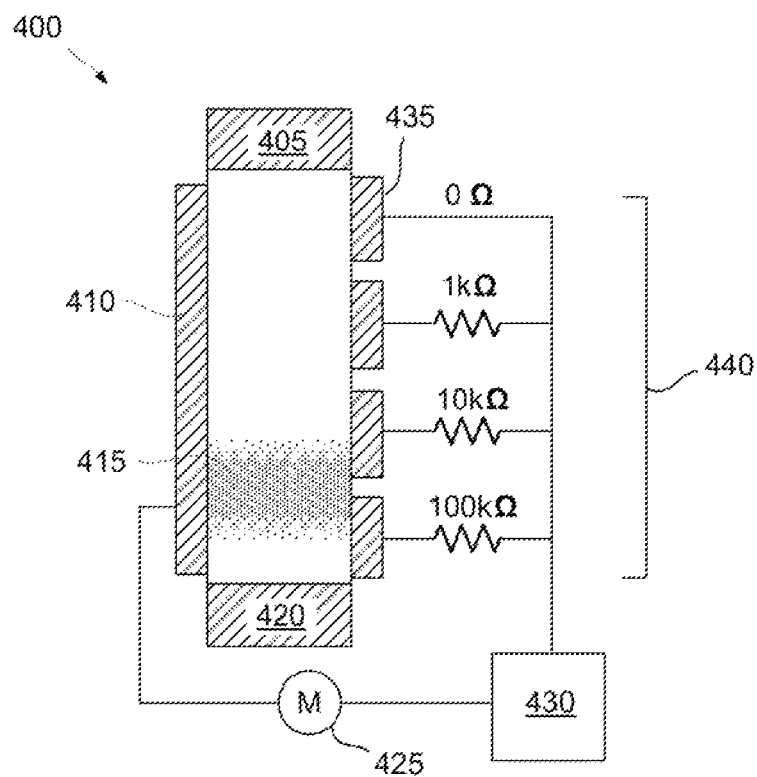

In FIG. 4E, the programming electrodes (405, 420) have been energized such that the dopant band (415) has again been moved downward. The central portion of the dopant band (415) now contacts both the 10 kΩ and the 100 kΩ resistors.

Figure 4F:
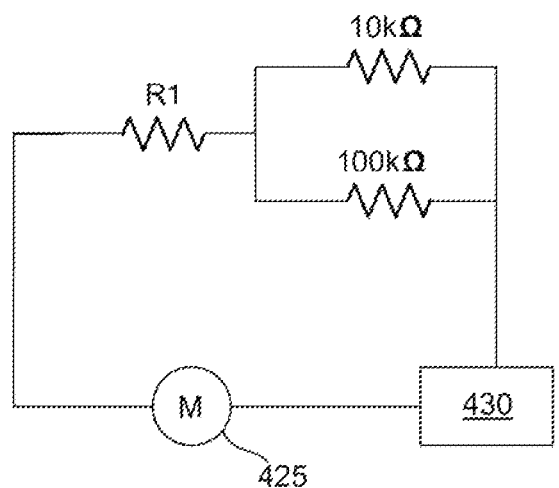

FIG. 4F shows an electrical schematic of the system illustrated in FIG. 4E. The resistance of the memristive device (400) and resistor network (440) is illustrated as a first resistor (R1) which is connected to both the 10 kΩ and the 100 kΩ resistor. The elimination of the second resistance R2, results in a lower resistance than either of the two configurations illustrated in FIGS. 4A-4D. Consequently, by precisely positioning dopant band, a variety of resistances can be achieved. In very precise applications, combinations of resistors which would produce a narrow range of values could be used. The dopant band could then precisely tune the total resistance to the desired value by selectively contacting a specific resistor combination.

Additionally or alternatively, a memristive device may be used to create a variable capacitor. For example, capacitors of various sizes could be substituted for the resistors shown the resistor network (440). The memristive device could then be used to select switch between various capacitors as described above.

Figure 5A:
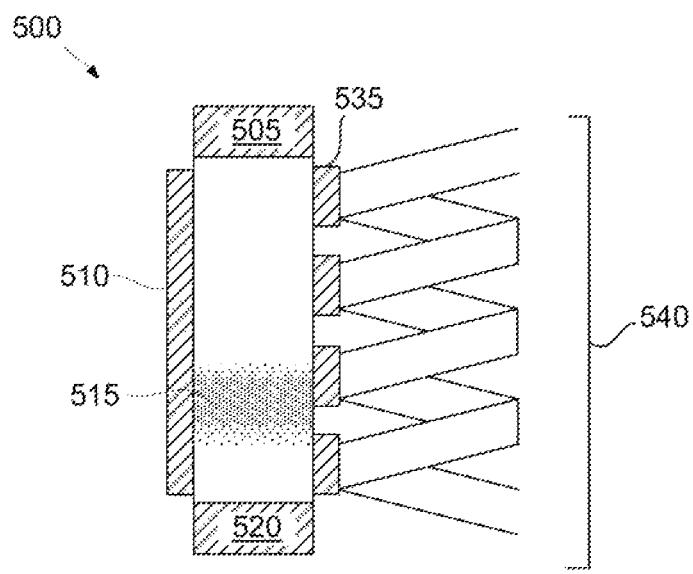
FIGS. 5A and 5B are diagrams of an illustrative multiplexing memristive device configured to alter inductance or act as a solid state autotransformer, according to one embodiment of principles described herein.
Figure 5B:
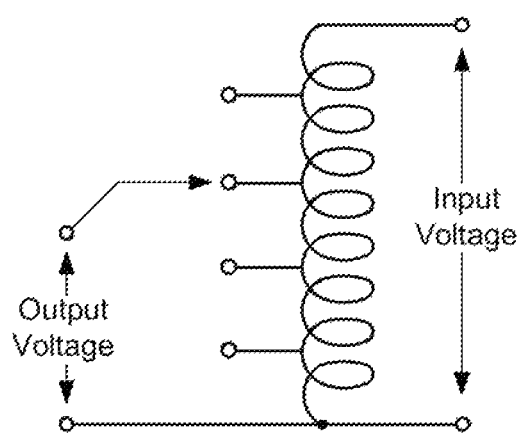

FIGS. 5A and 5B show a memristive multiplexer/de-multiplexer (500) with the input/output electrodes (535) connected to various windings of a coil (540). As previously discussed the programming electrodes (505, 520) generate an electrical field which moves the dopant band (515) within the memristive matrix. When the coil (540) is being used as an inductor within a system, the memristive device (500) can be used to adjust the total inductance in the circuit by moving the dopant band (515) to contact one or more of the input/output electrodes (535). By creating a connection to one of the windings within the inductor, the dopant band (515) allows current to pass through only a selected portion of the coil (540), thus changing the total inductance of the attached circuit.

FIG. 5B illustrates an electrical schematic of the memristor device (500) and coil (540) being used in an autotransformer application. An autotransformer is an electrical transformer with only one winding. The auto 3D transformer is used to selectively reduce an input voltage (voltage source) to produce an output voltage (load) of a desired magnitude. The winding has a number of electrical connections called taps. One tap at the bottom of the winding is used as a common connection between the input voltage source, the coil, and the load. By selectively connecting to one or more of the output taps shown on the right hand side of the coil, the output voltage can be varied. When a larger output voltage is desired, an output tap can be selected which includes the majority of the windings that can be selected. When a lower output voltage is desired, a lower tap can be selected which includes a smaller portion of the coils. The dopant band within the memristive device (500) could be positioned to contact the desired tap and conduct the resulting voltage and current through the memristive matrix to the output electrode (510). A memristive device (500) with a distributed dopant band could be particularly effective in fine tuning the output voltage because of the ability of the distributed dopant band to gradually contact a second coil while maintaining contact with a first coil.

Figure 6:
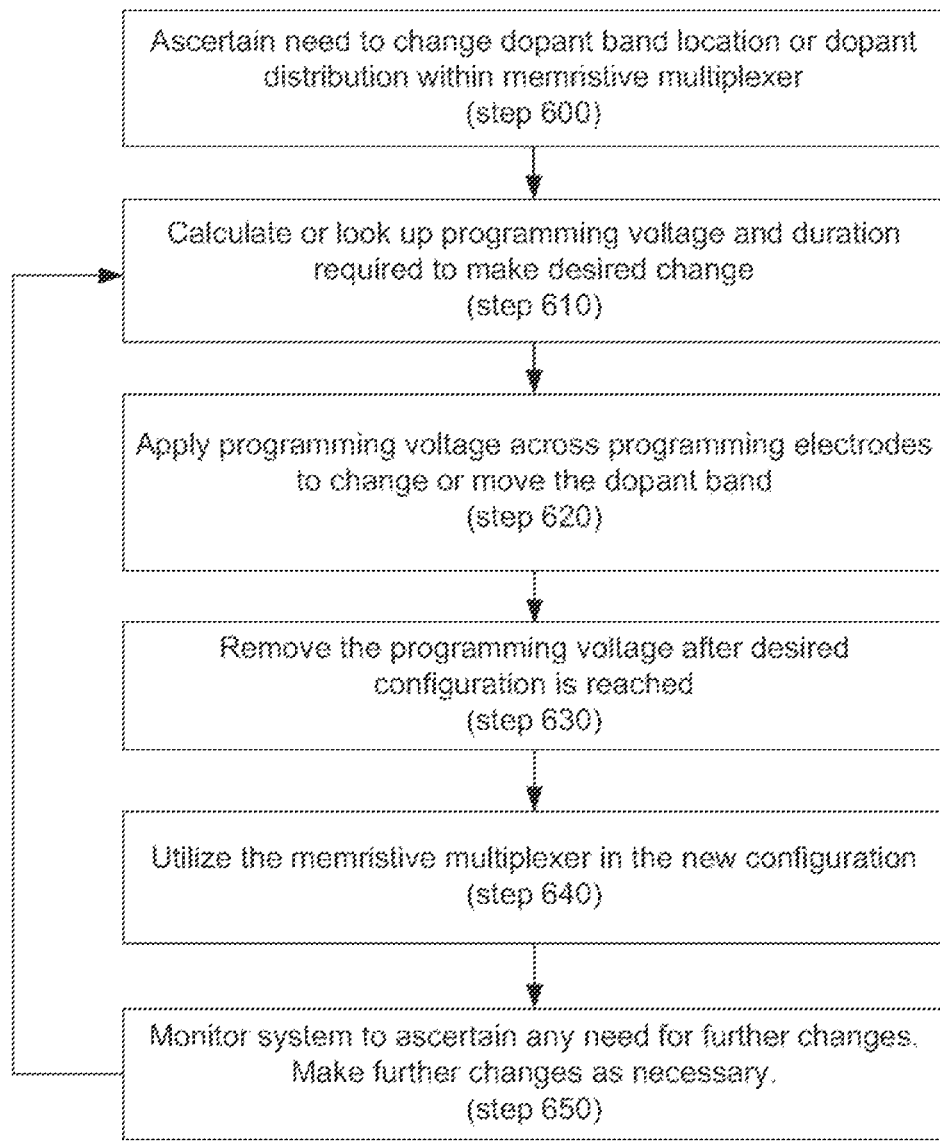
FIG. 6 is flowchart showing one illustrative method for using a multiplexing memristive device, according to one embodiment of principles described herein.

FIG. 6 is a flowchart describing one illustrative method for using a memristive multiplexer/de-multiplexer. In a first step, a need to change the dopant band or dopant distribution is ascertained (step 600). This need may be ascertained in variety of ways. For example, a multiplexer or de-multiplexer may have a regular switching routine or an external event may trigger the need to change the distribution of dopants. Additionally or alternatively, a measuring device or sensor may be used to discover a need to change the dopant band location. In some circumstances, the circuit performance may indirectly indicate that a change in dopant band location is required.

After determining the desired change in location and/or composition of the dopant band, the programming voltage and duration required to implement the desired change are calculated or looked up (step 610). The calculation process or look up process may be performed in a variety of ways, including but not limited to, accessing a value on a look up table, making a calculation with microprocessor, or simply accessing one or more hard wired components. Alternatively, the calculation or look up may be manually performed and input into the device as a direct voltage. In some circumstances, the memristive multiplexer/de-multiplexer may be self programming. For example, the configuration of the memristive multiplexer/de-multiplexer could be changed using a feedback loop in which a circuit alters the programming voltages based on the conductance between the input and output lines.

The programming voltage is then applied across the programming electrodes to create an electrical field which moves the dopants into the desired configuration (step 620). According to one illustrative embodiment, the programming voltage may not be a single value, but a series of voltages. In some situations, feedback control may be desired to reach the desired configuration. Feedback control could provide faster or more exact positioning of the dopants. The programming voltage is removed after the desired configuration is reached (step 630).

The memristive device is then utilized in the new configuration (step 640). Additionally, the system may be monitored to ascertain any need for further changes and further changes can be made as necessary (650).

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A multiplexer/de-multiplexer memristive device comprising:
   a memristive matrix, said memristive matrix containing mobile dopants;
   programming electrodes, said programming electrodes being configured to apply an electrical field across said memristive matrix such that said mobile dopants form a conductive band, said conductive band remaining stable after removal of said electrical field;
   a base electrode, said base electrode being disposed along a first side of said memristive matrix; and
   a plurality of input/output electrodes disposed on a second side of said memristive matrix, said programming electrodes selectively applying said electrical field such that said conductive band selectively forms an electrical connection between said base electrode and one of said plurality of input/output electrodes.

2. The device of claim 1, wherein said single conductive band connects said base electrode to more than one of said plurality of input/output electrodes.

3. The device of claim 2, wherein said single conductive band connects said base electrode to one of said input/output electrodes with a first electrical resistance and connects said base electrode to another of said input/output electrodes with a second higher electrical resistance.

4. The device of claim 1, wherein said programming electrodes are electrically insulated from said memristive matrix.

5. The device of claim 1, wherein said memristive matrix is generally rectangular in shape; said memristive matrix having a first short side and an opposing second short side and a first long side and an opposing second long side; a first programming electrode being disposed on said first short side and a second programming electrode being disposed on said second short side; said base electrode contacting a substantial portion of said first long side and said plurality of input/output electrodes being separately disposed along said second long side.

6. The device of claim 1, wherein said multiplexing memristive device is configured to switch electrical signals, said electrical signals representing one or more data streams.

7. The device of claim 1, wherein said multiplexing memristive device is configured to act as a multiplexer and a de-multiplexer.

8. The device of claim 1, wherein said multiplexing/de-multiplexing memristive device is configured to selectively make electrical contact with external electrical components to tune or repair an electrical circuit.

9. The device of claim 8, wherein said external electrical components comprise one or more of: a resistor, a capacitor, and an inductor.

10. The device of claim 8, further comprising a resistor network comprising resistors of different electrical resistance, wherein said multiplexing/de-multiplexing memristive device makes selective contact with said resistor network to tune a circuit.

11. The device of claim 8, further comprising a coil, wherein said multiplexing/de-multiplexing memristive device is further configured to selectively contact turns within said coil.

12. The device of claim 11, wherein said multiplexing/de-multiplexing memristive device is further configured to act as an autotransformer.

13. The device of claim 8, wherein said multiplexing/de-multiplexing memristive device is further configured selectively contact one or more capacitive plates to produce a variable capacitance.

14. The device of claim 1, wherein said memristive matrix is made of any of $TiO_2$, $ZrO_2$, $HfO_2$, $SrTiO_3$, GaN, CuCl and GaN.

15. A method for operating a multiplexing/de-multiplexing memristive device, comprising:
   applying a electrical field to achieve a first dopant configuration in a memristive matrix, said first dopant configuration connecting a base electrode to an first input/output electrode;
   removing said electrical field; and
   conducting an electrical current from between said base electrode and said first input/output electrode;
   applying a second electrical field to achieve a second dopant configuration, said second dopant configuration connecting said base electrode to a second input/output electrode;
   removing said second electrical field; and
   conducting an electrical current from said base electrode to said second input/output electrode.

16. The method of claim 15, further comprising:
   sensing a circuit characteristic; and
   calculating said programming electrical field such that a desired change is made to said circuit characteristic.

17. A method of operating a multiplexer/de-multiplexer memristive device, said device comprising:
   a memristive matrix, said memristive matrix containing mobile dopants;
   programming electrodes;
   a base electrode, said base electrode being disposed along a first side of said memristive matrix; and
   a plurality of input/output electrodes disposed on a second side of said memristive matrix,
   said method comprising:
   with said programming electrodes, selectively applying an electrical field such that a conductive band of said mobile dopants selectively forms an electrical connection in said memristive matrix between said base electrode and a selected one of said plurality of input/output electrodes, said conductive band remaining stable after removal of said electrical field; and
   after removal of said electrical field, conducting current through said conductive band of mobile dopants between said base electrode and the selected one of said plurality of input/output electrodes.

18. The method of claim 17, further comprising, with a single conductive band, connecting said base electrode to more than one of said plurality of input/output electrodes.

19. The method of claim 17, further comprising, with said conductive band, making selective contact with a resistor network to tune a circuit.

20. The method of claim 17, further comprising, with said conductive band, selectively making electrical contact with a turn within a coil of an autotransformer.

* * * * *